Aug. 21, 1962 R. C. HEYSER 3,050,688

TRANSISTOR AMPLIFIER

Original Filed Oct. 21, 1957

2 Sheets-Sheet 1

INVENTOR.

Richard C. Heyser

BY Lyon & Lyon

ATTORNEYS

Aug. 21, 1962 R. C. HEYSER 3,050,688

TRANSISTOR AMPLIFIER

Original Filed Oct. 21, 1957 2 Sheets-Sheet 2

INVENTOR.
Richard C. Heyser

BY Lyon & Lyon

Attorneys

United States Patent Office 3,050,688

Patented Aug. 21, 1962

3,050,688
TRANSISTOR AMPLIFIER

Richard C. Heyser, La Canada, Calif., assignor to California Institute Research Foundation, a corporation of California Continuation of application Ser. No. 691,254, Oct. 21, 1957. This application Feb. 10, 1961, Ser. No. 88,492
7 Claims. (Cl. 330—24)

This application is a continuation of application Ser. No. 691,254 filed October 21, 1957, for Transistor Amplifier, now abandoned.

This invention relates to transistor amplifiers and, more particularly, to improvements therein.

An object of the present invention is to provide a novel transistor power amplifier.

Another object of the present invention is to provide a high-efficiency transistor power amplifier.

Yet another object of the present invention is the provision of a compact transistor power amplifier which has characteristics comparable with those of quality vacuum-tube amplifiers.

These and other objects of the invention are achieved by employing four transistors which are arranged in a bridge configuration such that a load may be driven anti-symmetrically by a push-pull input signal. Two of the transistors are load-driving transistors, and their emitters are coupled to either side of the load. A push-pull driving signal is applied to their bases. The remaining two transistors, which will be designated as the current-source transistors, are coupled to the load-driving transistors to insure that they will remain in conduction at all times. As a result, the power amplifier operates substantially as a class AB amplifier. In response to the driving signal current may be drawn through the load from a current source transistor through the load to the load-driving transistor on the opposite end of the load.

The novel features that are considered characteristic of this invention are set forth with particularity in the appended claims. The invention itself, both as to its organization and method of operation as well as additional objects and advantages thereof, will better be understood from the following description when read in connection with the accompanying drawings in which:

Figure 1:
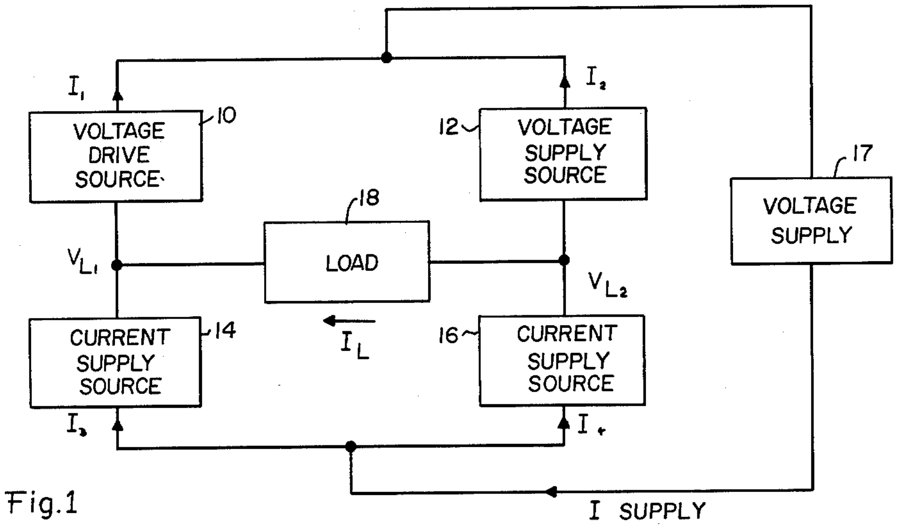
FIGURE 1 is a block diagram of the basic features of the invention.

Referring now to FIGURE 1, there may be seen a block diagram of the basic configuration of this invention. This includes two voltage drive sources 10, 12 and two current supply sources 14, 16 connected in a bridge configuration with a load 18 connected across the diagonal of the bridge. It is assumed that the voltage sources are to be operated in a linear mode and hence the current through them should not drop below a critical quiescent value denoted by $I_Q$, although under signal conditions full load current may be drawn through them. Under signal conditions a load current must be provided which is equal to the quotient of the potential difference across the load to the value of the load impedance.

Figure 2:
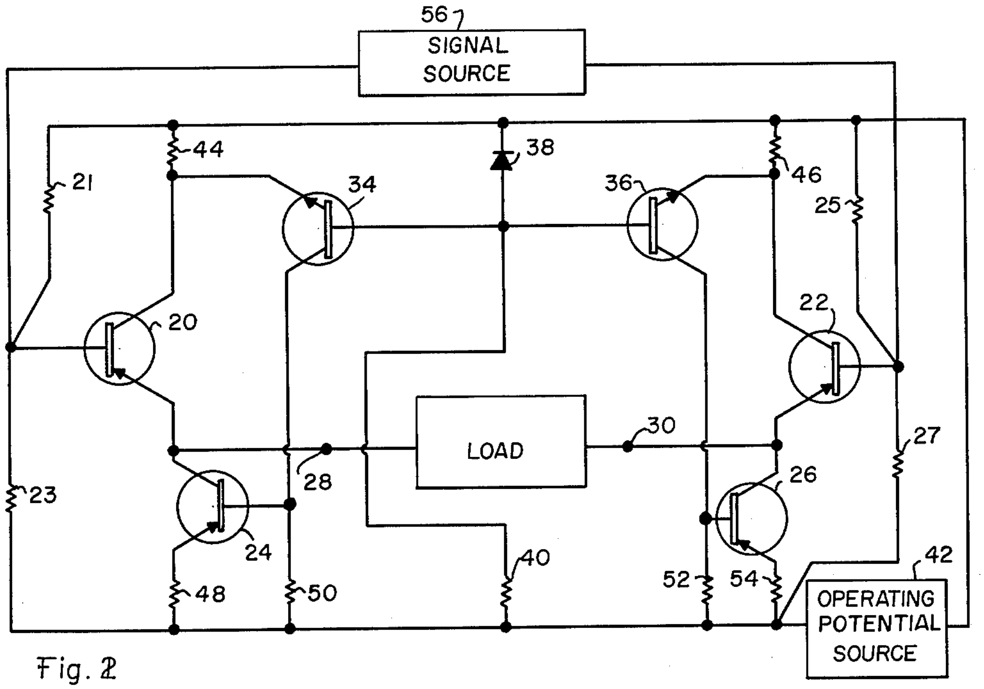
FIGURE 2 is a circuit diagram of one embodiment of the invention employed as a power amplifier.
Figure 3:
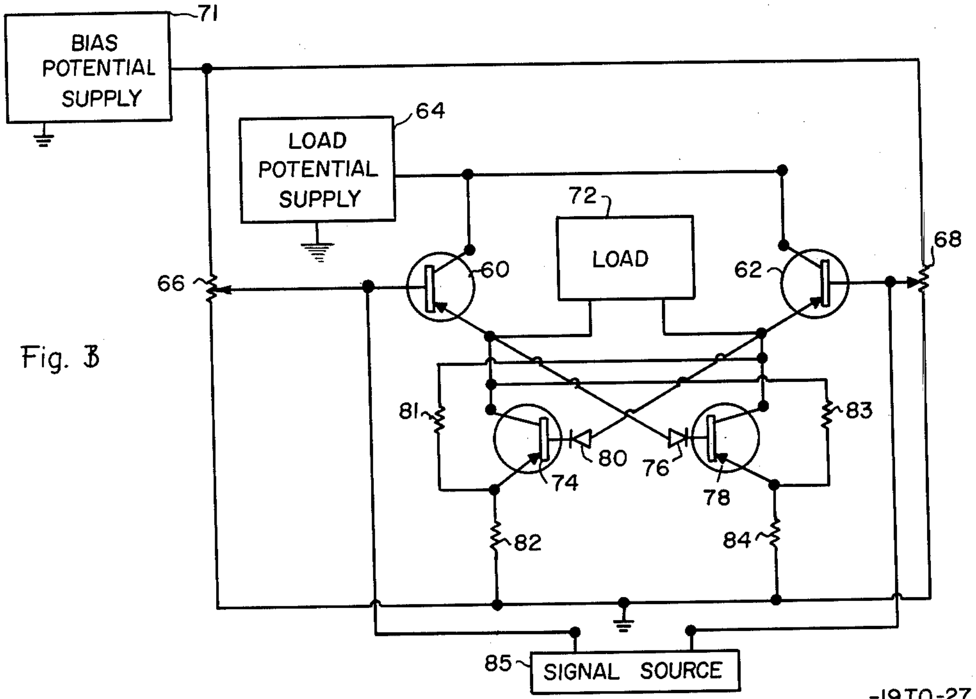
FIGURE 3 is a circuit diagram of the basic features of another embodiment of the invention.
Figure 4:
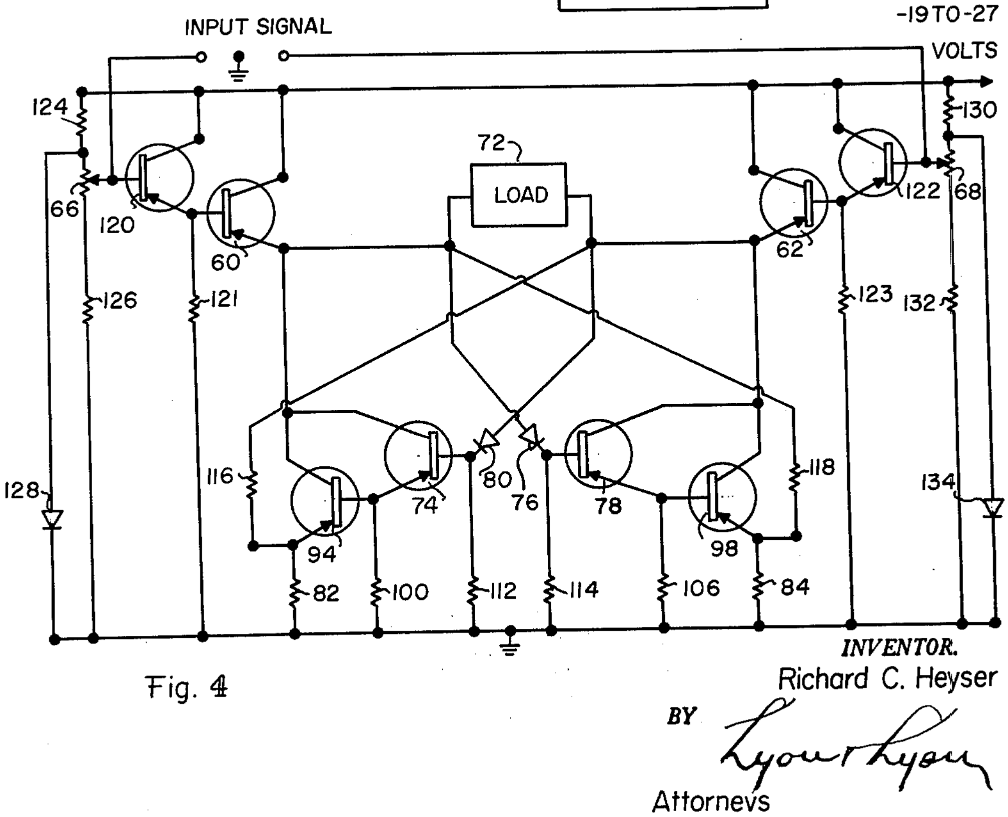
FIGURE 4 is a circuit diagram of the second embodiment of the invention used as a power amplifier.

Two techniques may be employed for obtaining this relationship. In one of these the magnitude of the current drives $I_3$, $I_4$ are so controlled that at no time does $I_1$ or $I_2$ respectively fall below the quiescent value $I_Q$. In the other technique, the magnitudes of the current drives are controlled by the potentials across the load. FIGURE 2 illustrates a circuit for carrying out the first technique and FIGURES 3 and 4 illustrate a circuit for carrying out the second technique.

Referring now to FIGURE 2, there are shown a first and second load driving transistor 20, 22, corresponding to the voltage drive sources 10, 12. There is also shown a first and second current source transistor 24, 26 respectively corresponding to the current supply sources 14, 16. Two resistors 21, 23 are connected in series across the operating potential source 42. The base of load driving transistor 20 is connected to the junction of these two resistors. Two other resistors 25, 27 are connected in series across the operating potential 42. The base of load driving transistor 22 is connected to the junction of these two resistors. The emitters of the load driving transistors are respectively connected to the collectors of the current driving transistors 24, 26. These junctions are also respectively connected to a first and second load terminal to which a load 32, such as a loud speaker voice coil may be connected.

First and second bias transistors 34, 36 respectively have their emitters connected to the collectors of the first and second load driving transistors and their collectors connected to the bases of the first and second current supply transistors. The junction of a diode 38 and a resistor 40 connected in series is connected to the bases of the first and second bias transistors. The diode and resistor are connected across the output of a source of operating potential 42. A first and second resistor 44, 46 respectively connect the collectors of the first and second load-driving transistors to one side of the operating potential source. Third and fourth resistors 48, 54 respectively connect the emitters of the first and second current source transistors to the other side of source of operating potential. Fifth and sixth resistors 52, 50 respectively connect the bases of the first and second current source transistors to this side of the source of operating potential. Signals are applied from a signal source 56 to the bases of the load driving transistors 20, 22.

When no signal is applied to the bases of the transistors 20 and 22, there will be some collector current flowing in each which, in passing through the first and second resistors 44, 46 establish potential drops which are respectively applied to the emitters of the first and second bias transistors. The bias potential established at the bases of these bias transistors by the current through the diode 38 is on the order of 0.15 volt. Thus the bias transistors are respectively enabled to draw enough collector current through the resistors 50, 52 to apply a bias to the bases of the current source transistors 24, 26 to enable them to supply the quiescent current required by the load driving transistors 20, 22. Note that the bias transistors are of a type opposite to the type of the other transistors (NPN where others are PNP). Since the bias transistors need only supply the quiescent base current of the current-source transistors they may be small signal transistors.

Regulation of the quiescent current is automatic. Should the collector current drawn through the first and second resistors change for some reason the bias transistors respond in a manner opposite to the change thereby driving the current source transistors to oppose the change. The quiescent current value is set by the parameters of the circuit including the values selected for the first and second resistors and the value of the bias applied to the bases of the bias transistors.

Upon the application of a signal from the source 56, the bases of the load driving transistors are driven out of phase. If the signal swing is such that current should be drawn through the load from terminal 30 to terminal 28, then the signal current is carried by the load driving transistor 20.

As a result the $I_R$ drop across the first resistor due to the vastly increased collector current cuts off transistor 34 and thereby transistor 24. The required load current is drawn from load current source transistor 26. Bias transistor 36 insures that in addition to load current the quiescent current for load driven transistor 22 is provided. On alternate half cycles the roles of transistors 24 and 26 are interchanged.

It is thus seen that for the circuitry described at least a quiescent current is provided at all times and the quiescent current in the load current supply transistors is established in response to the quiescent current passing through the load driver transistors. In response to driving signals a load driver transistor derives current from the load current source transistor connected to the opposite side of the load.

If the load be reactive and of such a nature that a load current must flow even through the potentials across the load are not in phase with this current then the bias transistors will assure this conduction. In the absence of a load the quiescent current is still maintained. If the load is shorted then the maximum current which will flow is determined by the output impedance of the load driving transistors.

Reference is now made to FIFGURE 3 which shows the basic features of a circuit for controlling the current drives by the potentials across the load. This arrangement includes a pair of load-driving transistors 60, 62 having their collectors connected to a load supply potential source 64. The base of each of the load driving transistors is respectively connected to a bias-adjusting potentiometer 66, 68. Both of these bias-adjusting potentiometers are connected across a bias potential supply 71. The emitters of the respective load-driving transistors 60, 62 are connected on either side of a load 72. The emitter of load-driving transistor 60 is connected to the collector of a first current source transistor 74 and through a "Zener" diode 76 to the base of a second current-source transistor 78. The emitter of the second load-driving transistor 62 is connected to the collector of the second-current source transistor 78 and also through a Zener diode 80 to the base of the first current-source transistor 24. The emitter of current-source transistor 78 is connected through a resistor 82 to ground. The emitter of current-source transistor 78 is connected through a resistor 84 to ground. Push-pull driving signals are applied to the bases of the two load-driving transistors from signal source 85.

The current-source transistors 74, 78 serve to sustain a sufficient current drive through the load-driving transistors 60, 62 and through the load such that the load-driving transistors 60 and 62 at all times and under all signal application conditions remain in conduction. This requires that the magnitude of the impedance of resistors 82, 84 must be equal to or less than one-half of the magnitude of the load impedance. The Zener diodes are commercially purchasable silicon diodes which present a high reverse resistance until the voltage applied across them exceeds a predetermined value. They then present a low reverse resistance. The value of the quiescent current which is drawn through the load-driving transistors is established by the bias adjustments made at potentiometers 66 and 68, respectively. Since, in order to obtain power, the load-driving transistors are selected to be power transistors, the adjustments of potentiometers 66 and 68 once made are substantially independent of transistor variations because of the large-emitter-mutual conductance of power transistors, which requires a very small emitter-to-base potential variation for large-emitter current variation. The mode of operation is thus selected by the bias adjustment.

At "no-driving-signal" conditions, each Zener diode has its maximum resistance value, since the voltage across it is less than its breakdown value (about 14.5 volts). Thus, very little base current can flow through the current-source transistors, and, therefore, the current flowing through each load-driver transistor and through the current-source transistors through the respective resistors 82, 84 to ground is a very small value determined by the setting of potentiometers 66, 68, the values of resistors 82, 84, and the high resistance values of the Zener diodes.

When driving signals are applied to the load-driver transistors, the negative voltage outputs at their emitters will be large enough to cause the Zener diodes to assume their low resistance values. At this time, the current-source transistors can provide large values of current, where this is required, by large input signal values which would otherwise drive the load-driver transistors into current cutoff.

Heretofore, to maintain the load-driver transistors in a current conduction condition to handle large input value signals, passive resistive elements were used in place of the current-source transistors, and it was necessary to maintain a fairly large value of quiescent current. This, of course, is inefficient, since the current drawn through the passive-resistive element at all times is dissipated in its resistance as heat. The range of signals which were handled was limited. By means of this invention, a minimal current is drawn in the quiescent state, and the current required in response to large input signals is provided by the active elements. For example, a signal calling for an increased current from load-driver transistor 60 will cause a signal to be applied through Zener diode 76 to the base of current-source transistor 78. Load current can then be supplied through that transistor, through the load, to load-driver transistor 60.

It may be preferable to avoid drawing the quiescent current through the current-source transistors. In this event, a first resistor 81 may be connected between the emitter of the load-driver transistor 62 and the emitter of current-source resistor 74, and a second resistor 83 may be connected between the emitter of load-driver transistor 60 and the emitter of current-source transistor 78.

Because transistors 60 and 62 are in a linear mode of operation at all times, even though transistors 74 and 78 alternately are cut off to attain high efficiency, the effective output impedance and voltage transfer functions are dependent primarily upon the parameters of transistors 60 and 62. The load-driving transistors may also be termed emitter drivers and they are analogous to cathode followers in vacuum tubes.

FIGURE 4 shows the circuit diagram of an arrangement employing the basic circuit configuration of FIGURE 2 in a power amplifier arrangement. In this drawing, similar functioning structure will receive the same reference numerals. Thus, the load-driver transistors 60, 62 have their emitters coupled to drive the load 72, and their collectors are connected to the source of load supply potential. The base of each current-source transistor 74, 78 is respectively coupled to the emitters of the transistor 60, 62 through Zener diodes 76, 80. To provide sufficient current capacity, a second current-source transistor 94, 98 is employed in association with each one of the load current-source transistors 74, 78. These second current-source transistors 94, 98 are respectively coupled to be driven or cut off along with transistor 74, 78. The collector of transistor 94 is connected to the collector of transistor 74. The transistor 78 has its collector connected to the transistor 98 collector. The base of transistor 94 is connected to the emitter of transistor 74. The base of the transistor 98 is connected to the emitter of transistor 78. The emitter of transistor 94 is connected to ground through a resistor 82. The emitter of transistor 98 is connected to ground through a resistor 84. Resistors 82, 84 have their values selected to be less than half the load impedance, as in FIGURE 1. Resistors 100 and 106, respectively connect the base of transistors 94 and 98 to ground and function to minimize the effect of collector-base leakage current. A similar function is provided by resistors 112, 114 respectively connecting the base of transistors 74, 76 to ground.

A resistor 116 couples the emitter of transistor 62 through resistor 82 to ground. A resistor 118 couples the emitter to transistor 60 through resistor 84 to ground. By means of these resistors, transistors 60 and 62 have a current path to ground established when no signal is applied and the load current-supply transistors are cut off. It should be noted that transistors 74 and 94 are essentially connected in parallel to supply output current to the load when called for by a signal applied to Zener diode 80 to the base of transistor 74, and through its emitter to the base of transistor 94. Likewise, transistors 78, 98 have their collectors connected in parallel to supply current to the load when a signal is applied through Zener diode 76 to the base of transistor 78, and through its emitter to the base of transistor 98.

Transistors 60 and 62 are respectively driven by transistors 120, 122 using emitter-to-base coupling. The collectors of transistors 120 and 122 are connected to the load potential supply. Input signals to the arrangement are applied to the bases of transistors 120, 122. Resistors 121, 123 respectively serve the function of removing any collector-base current leakage.

The negative bias supply is derived from the negative load supply, thus reducing the power supply requirements to a single source. Dropping resistors 124, 126 are connected in series with potentiometer 66 to establish the bias potential. Rectifier 128 serves to bypass any signals in the bias circuit. Dropping resistors 130, 132 are connected in series with potentiometer 68 to establish the bias potential, and diode 134 bypasses any signals in the bias circuit. Bias potentiometers 66, 68 serve the same function as described for FIGURE 1, namely to establish the quiescent current drawn by the load driver and current supply transistors.

Due to the technique of obtaining collector voltage for the current-driver transistors, the maximum zero-to-peak signal voltages that may be switched across the load is slightly less than two-thirds of the voltage supply. This automatically reduces the available power output to 44.4 percent of the theoretical maximum. If the maximum efficiency for this configuration is computed, it can be shown that the average load power is almost five times the average transistor power dissipation per half cycle. This invention is admirably suited for driving loads, such as loudspeakers, directly and thus, by the elimination of the output transformer, enables high efficiency. In view of the common-mode operation, together with dependence only on the conductance of the load transistors, the power-supply regulation requirements are drastically reduced, and, further, a constant voltage gain from direct current to frequencies approaching the alpha cutoff of the transistors is obtained.

There has been described and shown herein a novel and useful transistor power amplifier which is operable in the AB mode and provides an efficient arrangement for directly driving low-impedance loads. Although the embodiment of the invention has been shown using a P-N-P transistor convention, it should be understood that this is not to be construed as a limitation on the invention or a restriction on the type of transistors which may be used, since such substitutions with the attendant circuit revisions are known and do not constitute a departure from the spirit or scope of the invention.

I claim:

1. A transistor amplifier for driving a load having a first and second end from a source of signals comprising a first and second load-driving transistor, a first and second current-source transistor, means coupling said load first end to said first load-driving transistor and said load second end to said second current-source transistor for current flow from said first load-driving transistor through said load to said second-current-source transistor, means coupling said load second end to said second load-driving transistor and said load first end to said first current-source transistor for current flow from said second load-driving transistor through said load to said first current-source transistor, means for applying opposite-phase input signals from said source to said first and second load-driving transistors, first Zener diode means for applying signals from said first load-driving transistor to said second current-source transistor, having the same phase as the input signal applied to said first load-driving transistor to control the conductive state of said second current-source transistor responsive to the conductive state of said first load-driving transistor, and second Zener diode means for applying signals from said second load-driving transistor to said first current-source transistor having the same phase as the input signal applied to said second load-driving transistor for controlling the conductive state of said first current-source transistor responsive to the conductive state of said second load-driving transistor.

2. A transistor amplifier for driving a load comprising a first and second load-driving transistor each having an emitter, collector and base, means coupling said load between the emitters of said first and second load-driving transistors, first and second current-source transistor means each having an input and output electrode, means coupling the output electrode of said first current-source transistor means to said load for current flow through said load to said second load-driving transistor, means coupling the output electrode of said second current-source transistor means to said load for current flow through said load to said first load-driving transistor, means for applying relatively opposite phase input signals to the bases of said first and second load-driving transistors, first Zener diode means connected to said first load-driving transistor to derive an output therefrom having the same polarity as the input signal thereto, means connecting said first Zener diode means to said second current-source transistor for controlling the conductive state of said second current-source transistor responsive to the conductive state of said first load-driving transistor, second Zener diode means connected to said second load-driving transistor for deriving an output therefrom having the same polarity as the input signal applied thereto, means connecting said second Zener diode means to said first current-source transistor for controlling the conductive state of said first current-source transistor responsive to the conductive state of said second load-driving transistor.

3. A transistor amplifier as recited in claim 2 wherein said first and second current-source transistor means each includes two transistors each having an emitter, a collector and a base, the base of one of said two transistors in said first current source transistor means being coupled to said second Zener diode means, the base of the other of said transistors in said first current-source transistor means being coupled to the emitter of said one of said two transistors, and the collectors of both said transistors in said first current-source transistor means being coupled together and to said load; the base of one of said two transistors in said second current-source transistor means being coupled to said first Zener diode means, the base of the other of said transistors in said second current-source transistor means being coupled to the emitter of said one of said two transistors, and the collectors of both of said transistors in said second current-source transistor means being coupled together and to said load.

4. A transistor amplifier for driving a load from a source of signals comprising a first and second load-driving transistor each having an emitter, collector and base, first and second terminals between which a load is coupled, means respectively coupling said first and second terminals to the emitters of said first and second load-driving transistors, first and second current-source transistors, each having an emitter, collector and base, means respectively coupling the bases of said first and second current-source transistors to the emitters of said second and first load driving transistors, each said last-named means including a diode having the property of providing a larger value of resistance in the conducting direction when there is applied thereto a voltage lower than a predetermined value than the value of resistance in a conducting direction when the voltage applied exceeds such predetermined value, means respectively coupling the collectors of said first and second current-source transistors to the emitters of said first and second load-driver transistors, means for applying bias to the bases of said first and second load-driving transistor to enable said transistors to have a desired value of quiescent current, means for applying operating potential between the collectors of said first and second load-driving transistors and the emitters of said first and second current-source transistors, and means for applying signals from said source to the bases of said first and second load-driving transistors.

5. A transistor amplifier for driving a load from a source of signals comprising first and second load-driving transistors each having a base, a collector and an emitter, a first and second load terminal between which a load is connected, means connecting said first load-driving transistor emitter to said first terminal and said second load-driving transistor emitter to said second terminal, means to apply out-of-phase signals from said source to the respective bases of said first and second load-driving transistors, means to apply a bias to the respective bases of said first and second load-driving transistors, first and second current-source transistor means, first and second diodes respectively coupling the emitters of said second and first load-driving transistors to the first and second current-source transistor means, each said first and second diodes being of a type which presents a higher resistance when voltages which are less than a predetermined value are applied thereacross than when voltages which exceed such predetermined value are applied thereacross, each said first and second diodes being coupled in a direction to impede easy current flow from the emitters of the respective load-driving transistors, means to respectively couple said first and second load terminals to said first and second current-source transistor means, a first and second resistor having a value up to one-half of the load impedance, one end of each said first and second resistors being respectively coupled to said first and second current-source transistor means, and means to apply operating potential to the other ends of said first and second resistors and to the collectors of said first and second load-driving transistors.

6. A transistor amplifier as recited in claim 5 wherein said first transistor current-source means includes a first current source transistor having base, emitter, and collector electrodes, means coupling the base of said first current-source transistor to said first diode, means coupling the collector of said first current-source transistor to said first load terminal, means coupling the emitter of said first current-source transistor to one end of said first resistor, and a third resistor connected between the emitter of said first current-source transistor and said second load terminal; said second transistor current-source means including a second current-source transistor having base, emitter, and collector electrodes, means coupling the base of said second current-source transistor to said second diode, means coupling said second current-source transistor collector to said second load terminal, means coupling said second current-source transistor emitter to one end of said second resistor, and a fourth resistor connected between said second current-source transistor emitter and said first load terminal.

7. A transistor amplifier as recited in claim 5 wherein said first current-source transistor means includes a first and a second transistor each having an emitter, collector, and base, means coupling the base of said first transistor to said second diode, means coupling the collectors of said first and second transistors to said first load terminal, means coupling the base of said second transistor to the emitter of said first transistor and to one end of said first resistor, and a third resistor coupled between the emitter of said second transistor and said second load-driving terminal; said second current-source transistor means includes a third and fourth transistor each having a collector, emitter, and base electrode, means connecting the collectors of said third and fourth transistors to said second load terminal, means connecting the base of said third transistor to said first diode and to one end of said second resistor, means connecting the base of said fourth transistor to the emitter of said third transistor, and a fourth resistor connected between the emitter of said fourth transistor and said first load terminal.

No references cited.